United States Patent
Chuang

(10) Patent No.: US 6,369,744 B1
(45) Date of Patent: Apr. 9, 2002

(54) DIGITALLY SELF-CALIBRATING CIRCUIT AND METHOD FOR PIPELINE ADC

(75) Inventor: Shang-Yuan Chuang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/589,691

(22) Filed: Jun. 8, 2000

(51) Int. Cl.[7] ................................................ H03M 1/14
(52) U.S. Cl. ...................................... 341/161; 341/120
(58) Field of Search ................................ 341/161, 155, 341/162, 120

(56) References Cited

U.S. PATENT DOCUMENTS

| | | | |
|---|---|---|---|
| 5,274,377 A | * 12/1993 | Matsuura | 341/161 |
| 5,499,027 A | 3/1996 | Karanicolas et al. | 341/120 |
| 5,821,893 A | * 10/1998 | Kumamoto | 341/161 |

OTHER PUBLICATIONS

"Digital–Domain Calibration of Multistep Analog–to–Digital Converters" by Lee et al., IEEE Journal of Solid–State Circuits, vol. 27, No. 12, Dec. 1992, pp.1679–1688.

* cited by examiner

Primary Examiner—Brian Young
(74) Attorney, Agent, or Firm—W. Daniel Swayze, Jr.; W. James Brady; Frederick J. Telecky, Jr.

(57) ABSTRACT

A pipeline ADC includes an input stage and a first group of subsequent stages, wherein the input stage includes a unity gain amplifier having an input for receiving an analog input signal, an output, and first and second comparators each having a first input coupled to the output of the unity gain amplifier. The first comparator has a second input for receiving a first reference voltage an first output, and the second comparator has a second input for receiving a second reference voltage and an output. The input stage includes a full adder coupled to the output of the first comparator, a second input coupled to the output of the second comparator, and an output producing MSB bit information. Each subsequent stage includes an amplifier of gain greater than 2 having an input and an output, a summer having a first input coupled to the output of the amplifier of gain greater than 2, a second input, and an output, a switching circuit operating in response to the outputs of the first and second comparators of a previous stage to selectively couple one of a third reference voltage, a fourth reference voltage, and fifth reference voltage to a second input of the summer. Each subsequent stage also includes a full adder having a first input coupled to the first output, a second input coupled to the second output, the full adder producing bit information less significant than the MSB bit information. In the described embodiment, the third reference voltage is a negative reference voltage, the fourth reference voltage is a ground reference voltage, the fifth reference voltage is a positive reference voltage. The first reference voltage is midway between the third reference voltage and the ground reference voltage, and the second reference voltage is midway between the ground reference voltage and the fifth reference voltage. Each switching circuit operates to decode with three states represented by the first and second comparators of the previous stage. The plurality of stages include a second group of subsequent stages of lower binary bit significance than the first group of subsequent stages, the first group of subsequent stages being recursively self-calibrated, the second group of subsequent stages being not self-calibrated. The pipeline ADC is included in a self-calibrating pipeline ADC including a plurality of analog-to-digital conversion units and a recursive calibrating section operable for calibrating errors associated with an immediately preceding first conversion unit.

22 Claims, 10 Drawing Sheets

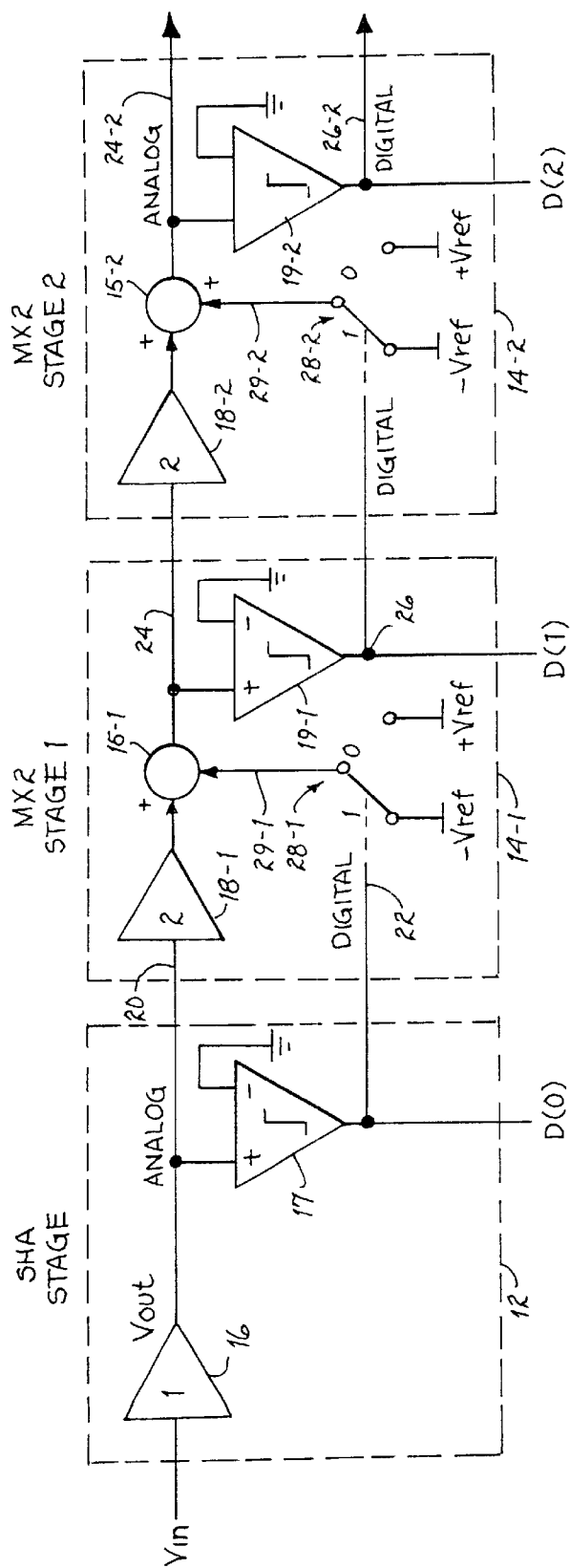
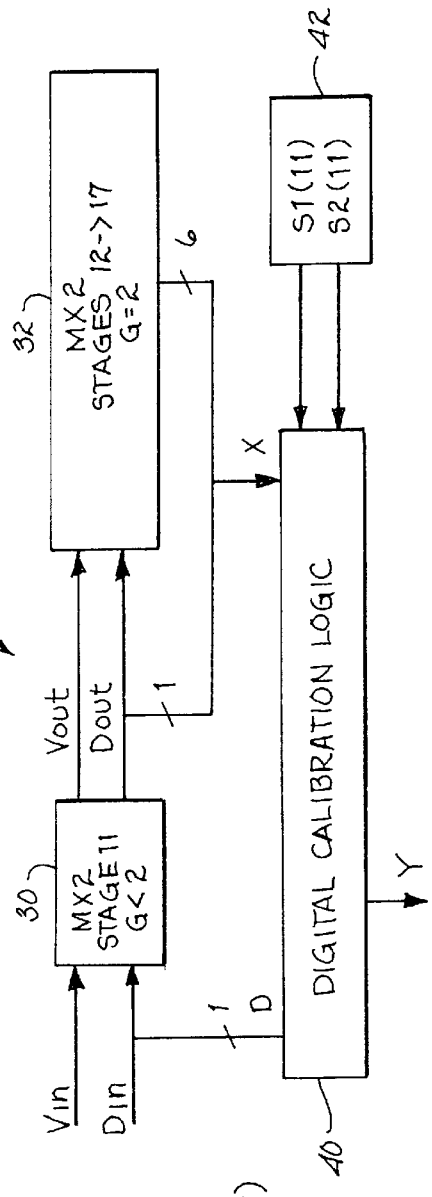
FIG. 1A (PRIOR ART)
FIG. 1B (PRIOR ART)

DIGITALLY SELF-CALIBRATING CIRCUIT AND METHOD FOR PIPELINE ADC

BACKGROUND OF THE INVENTION

The performance of a switched capacitor pipeline ADC is very sensitive to (1) mismatch in the capacitors thereof, (2) variation in the finite gain of the operational amplifiers therein, (3) to the accuracy of the reference voltage applied to each stage and (4) charge injection from the switches of the switched capacitor circuitry. Several self-calibration techniques/structures have been described in the prior art.

FIG. 1A shows a 1-bit per stage pipeline ADC of a self-calibrating pipeline ADC described in prior art U.S. Pat. No. 5,499,027 (Karanicolas et al.), with a sample-hold stage 12 followed by N multiply-by-two stages of 14-1, 14-2 etc. Each multiply-by-two stage has an analog input, a one-bit digital input, an analog output, and a one-bit digital output. For example, multiply-by-two stage 14-1 receives analog input 20 and digital input 22, and produces analog output 24 and digital output 26. Multiply-by-two stage 14-2 receives analog input 24 and digital input 26, and produces analog output 24-2 and digital output 26-2. The sample and hold stage and the multiply-by-two stage each utilize a single comparator to generate the respective digital output bits. The digital self calibration circuitry is not shown in FIG. 1A, but is shown in FIGS. 1B and 1C. The quantized representation of Vin is D0, D1, D2 . . . , which is the data word X in FIGS. 1B and 1C.

U.S. Pat. No. 5,499,027 (the '027 patent) explains that if the residue exceeds the reference boundary due to charge injection offset, comparator offset, or capacitor mismatch, this results in missing decision levels which result in missing codes and consequently in errors in the output word X. The '027 patent explains that missing codes are caused whenever the output of any stage in a radix 2 pipeline ADC exceeds the reference boundary, and that the gain G should be substantially less than 2 in the stages to be calibrated, in order to prevent the residue from being outside of the reference boundary and causing the missing decision levels and the resulting missing codes.

It should be understood that the Vin vs. Dout transfer characteristic of an ideal pipeline ADC is a straight line. The above mentioned missing codes produce discontinuities in the ideal transfer characteristic so that it is not a straight line. The purpose of the self-calibrating described in the '027 patent is to "smooth out" the discontinuities introduced into the transfer characteristic by the missing codes.

FIGS. 1B and 1C illustrate the recursive self calibration digital logic for calibrating multiply-by-two stage 11 first, and later calibrating MX2 stage 10, etc. The '027 patent describes pipeline ADC 10 as having the first 11 stages with gains set to 1.93 and the last six stages with gains set to 2. The calibration operation begins by calibrating the $11_{th}$ stage, and then continues by calibrating the $10^{th}$ stage, and continuing stage by stage to the first stage 14-1. The gain of 1.93 was chosen to ensure enough gain reduction that the residue never exceeds the reference boundary even in the worst case when the maximum capacitor mismatch, maximum comparator offset, and maximum charge injection error magnitudes are summed together.

In FIG. 1B, the outputs D of "stage 10" (not shown) and X of stages 11–17 are provided to digital calibration logic 40 along with stored calibration constants $S_1$ and $S_2$ previously determined and stored for stage 11. $S_1$ and $S_2$ correspond to the values of the data word X when Vin is equal to 0 and D equals 0 and D equals 1, respectively. The digital self calibration process for each stage is described by Y=X if D=0, and Y=X+$S_2$- $S_2$ if D=1, where D is that the decision, X is the "raw code" digital output word and Y is the "transformed code" digital output word. $S_1$-$S_2$ is stored for each of the calibrated stages 0–11. To initially determine $S_1$ for stage 11, the analog input is set to 0 and the input bit for stage 11 is forced to 0. The quantity X in this condition is $S_1$ for stage 11, and then the input bit for stage 11 is forced to 1 and in that condition the quantity X is $S_2$ for stage 11.

With the digital calibration of stage 11 accomplished, the digital calibration of the next most significant stage 10 can proceed in the same Fashion, as illustrated by FIG. 1C. Similarly, with the digital calibration of stage 10 accomplished, the digital calibration of the next higher stage 9 can proceed in the same fashion, and so forth all the way to stage 1. Since the digital self calibration aligns the points $S_1$ and $S_2$ using values measured under the same conditions as during the normal conversion, the digital self calibration automatically accounts for capacitor mismatch, charge injection, and finite operational amplifier gain.

It is important to recognize that the switches in blocks 14-1 and 14-2, which function as digital-to-analog converters, operate so as to connect the lower input of each analog summer to either $-V_{ref}$ or $+V_{ref}$. If the gain of the amplifier 18-1 and amplifier 18-2 is exactly 2 or slightly greater, the self-calibrating ADC "clips" the digital output thereof because the calibrating occurs at a level close to the full scale output value. Stated differently, if the gains of the stages to be digitally calibrated are too close to 2, then the ADC "over-ranges" its output. The digitally self calibrated pipeline ADC of the '027 patent therefore uses a reduced gain of 1.93 for the amplifiers 18-1 and 18-2 and the corresponding amplifiers in all of the self-calibrating stages in order to ensure that the maximum raw digital output value is less than full scale under the worst case condition of maximum capacitor mismatch, maximum comparator offset, and maximum charge injection error magnitude. This enables the self-calibrating ADC of the '027 patent current to accomplish digital self calibration using subtraction only, which is much less complex than using an adder-subtracter.

Most practical implementations of the pipeline ADC disclosed in the '027 patent would be fully differential. A major problem with the self-calibrating pipeline ADC of the '027 patent is that if the differential input signal is very small in magnitude (as often is the case), the worst case transitions from all "1"s to all "0"s would occur at the zero-crossing points, i.e., at ground or zero volts. The distortions in the digital output signal would be caused by the input offset voltages of the comparators. Such distortions usually would be disproportionately large compared to the amplitudes of the low amplitude differential input signals, and of course, the associated low SNR (signal to noise ratio) would be very undesirable.

The described reduction of the gain G in the '027 pipeline ADC to a value appreciably less than 2 to avoid clipping of the output caused by over-ranging also can reduce the accuracy of the pipeline ADC, and in fact is likely to prevent the digital output of the pipeline ADC from ever attaining all "0"s (and values very close thereto), and also from ever attaining all "1"s (and values very close thereto).

Another major problem of the self-calibrating pipeline ADC of the '027 patent is that the disclosed structure necessarily creates a substantial number of lost digital codes near minimum-scale and full-scale digital outputs. This occurs as a result of the disclosed technique of reducing the gain G of the individual bit stages being self-calibrated, to a value substantially less than 2 in order to avoid clipping of the digital output signal in response to minimum scale and maximum scale values of the analog input signal Vin. This problem can be understood by referring to FIG. 6 of the '027 patent and associated text. The problem results from the described subtracting technique for subtracting calibration constants from values of the digital output which are shifted due to missing codes that result from major code transitions that cause switching of comparators in the individual bit stages to be calibrated. Further understanding of the problem can be obtained from the subsequent description herein of FIG. 7A.

Another prior art reference is the article "Digital-Domain Calibration of Multistep Analog-to-Digital Converters", Lee et al., IEEE Journal of Solid-State Circuits, Volume 27, Number 12, December 1992. The Lee article describes a digital self-calibration technique which can directly cancel code errors in "multistep conversions". The described digital calibration technique uses add-on digital logic to subtract nonlinearity errors digitally from uncalibrated "raw" digital outputs. The article explains that the conversion rate of a flash ADC is inherently the fastest of all the existing ADC topologies, but the flash ADC suffers from requiring larger chip area, higher power dissipation, and high input capacitance. The Lee article explains that a multistep or pipeline ADC employs a fully serial approach with two or more stages. Each stage consists of a sample-and-hold amplifier (S/H), a low-resolution flash ADC, a DAC, and a residue amplifier, and that the primary advantages of the multistep or pipeline ADC are its high throughput rate due to the concurrent operation of the stages and its considerable reduction in area and power consumption. The Lee article also explains that the digital code-error calibration technique is applied to improve the linearity of this ADC by directly measuring and canceling cumulative code errors resulting from the capacitor ratio mismatch as well as from other non-linearity errors of the MDAC.

The Lee article discloses a digital self-calibrating, recycling two-step ADC whose linearity relies on matching the accuracy of capacitors in of a binary-weighted capacitor array. The two-step ADC uses an MDAC that performs the triple functions of a sample and hold circuit, a DAC, and a residue amplifier. The digital code-error calibration technique is applied to improve the linearity of this two stage ADC by directly measuring and canceling cumulative code errors resulting from capacitor ratio mismatches and other non-linear errors of the MDAC. The Lee article explains that the overall ADC linearity is limited by the mismatch of components at major code transition points, and that if less significant digital output codes are grouped as segments and each segment is dislocated by a certain amount from the ideal straight line of a plot of digital output vs. analog input, the digital amounts of dislocation measured from the ideal line are defined as "code errors", and that each dislocated segment can be moved back to the straight line by digitally subtracting the amount of dislocation from each digital output occurring in that range. The amounts of dislocation are directly measured during a calibration measurement cycle and stored in memory. The code errors are later addressed and recalled using coarse digital outputs from the first stage of flash ADC. The uncalibrated ADC produces raw digital data with a limited linearity during normal conversion, and the code error calibration is done with the raw digital data after the normal conversion is completed.

The described two-step ADC includes an input buffer amplifier, an MDAC, a flash ADC, digital correction and calibration logic, a binary encoder, memory, and digital control logic. The three clock phases are used so that the same flash converter can be used repeatedly for both the coarse and fine conversions. During the first clock phase, the input is sampled on the bottom plates of the MDAC capacitor array. During the second clock phase, the sampled and held input voltage is converted into "coarse" N+1 bits employing the flash ADC. These coarse N+1 bits are stored in the digital correction logic, and a voltage corresponding to the coarse N+1 bits is reconstructed using an (N+1)-bit DAC. During the third clock phase a residue voltage, which is the difference between the sampled and held input and the reconstructed output of the (N+1)-bit DAC, is amplified by $2^N$ and fine N+1 bits are obtained using the same flash ADC structure. The residue amplifier output should change by exactly half of the reference voltage $V_{ref}$ when the digital input code changes by 1. The $½V_{ref}$ value results from two unit feedback capacitors of the MDAC during the residue amplification phase which reduces the residue voltage by half. Code-error measurements begin by measuring the feedback error on the top plate of the MDAC capacitor array. During the first clock phase, a code Dj is applied to the MDAC switches connecting the bottom plates of the binary-weighted capacitors to either $V_{ref}$ or ground, while the top plate samples the operational amplifier offset voltage. At the same time, the bottom plate of the feedback capacitor 2C is connected to ground. During the next clock phase, the feedback capacitor is connected to the operational amplifier feedback $V_0$ while the bottom plates of the remaining capacitors remain unswitched. After charge redistributions, the feedthrough voltage $V_{FT}$ is generated at the operational amplifier output and digitized using the flash ADC. After the feedthrough voltage measurement, the segment error between two adjacent codes, Dj and Dj+1, is similarly measured. $V_{ref}$ and the feedthrough voltage $V_{FT}$ is subtracted from the digitized output—$½V_{ref}$, which is the error of the segment between the input codes Dj and Dj+1. The same procedure is repeated until all segment errors are measured. During normal conversion, coarse N+1 and fine N+1 bits are obtained. The coarse (N+1)-bit output is used as an MDAC code-error address. The fine N+1 bits are generated by digitized in an amplified residue voltage from the MDAC. The (N+1)-bit code error, which is stored in memory, is subtracted from the uncalibrated (2N+1)-bit digital output.

There is an unmet need for an integrated circuit self-calibrating pipeline ADC which avoids missing codes near maximum-full-scale and minimum-zero-scale values of the digital output.

There also is an unmet need for a differential integrated circuit self-calibrating pipeline ADC wherein high signal-to-noise ratio near the zero-crossing point of the digital output is obtained.

There also is an unmet need for an integrated circuit self-calibrating pipeline ADC having, a maximum dynamic range of its digital output and also having a high signal-to-noise ratio near zero-crossing point values of its digital output.

SUMMARY OF THE INVENTION

Accordingly, it is an object of the invention to avoid high distortion at zero-crossing points of a self-calibrating differential pipeline ADC.

It is another object of the invention to provide a self-calibrating pipeline ADC which avoids lost codes near maximum-full-scale digital output and/or minimum-full-scale values of the digital output.

It is another object of the invention to provide a self-calibrating pipeline ADC in which it is not necessary to provide a reduced gain of less than 2 in the individual stages to be calibrated in order to avoid clipping the digital output signal at values close to the minimum-full-scale or maximum-full-scale values of the digital output from.

It is another object of the invention to provide a self-calibrating pipeline ADC having a higher signal-to-noise ratio than can be achieved using the structure disclosed in prior art U.S. Pat. No. 5,499,027.

It is another object of the invention to provide a self-calibrating pipeline ADC having a is higher dynamic range of its digital output signal than can be achieved using the structure disclosed in prior art U.S. Pat. No. 5,499,027.

It is another object of the invention to provide a self-calibrating, differential pipeline ADC having both a high dynamic range of its digital output signal and low signal distortion, especially for low-magnitude analog input signals, and also having a high signal-to-noise ratio for low-magnitude analog input signals.

It is another object of the invention to provide a self-calibrating pipeline ADC in which the dynamic range of the digital output is not highly sensitive to the gain of the individual bit stages to be calibrated.

Briefly described, and in accordance with one embodiment thereof, the invention provides a pipeline ADC including a plurality of stages including an input stage (12) and a first group of subsequent stages (14-1,2 . . . ), wherein the input stage (12) includes a unity gain amplifier (16) having an input for receiving an analog input signal (Vin), an output (20), and first (17A) and second (17B) comparators each having a first input coupled to the output (20) of the unity gain amplifier (16). The first comparator (17A) has a second input for receiving a first reference voltage ($-\frac{1}{4}V_{ref}$) an first output (22A), and the second comparator (17A) has a second input for receiving a second reference voltage ($+\frac{1}{4}V_{ref}$) and an output (22B). The input stage includes a full adder (40A) having a first input coupled to the output (22A) of the first comparator (17A), a second input coupled to the output (22B) of the second comparator (17B), and an output (A14, A11) producing MSB bit information. Each subsequent stage (14-1,2, . . . ) includes an amplifier (18-1,2 . . . ) of gain greater than 2 having an input and an output, a summer (15-1,2 . . . ) having a first input coupled to the output of the amplifier of gain greater than 2, a second input, and an output (24-1,2 . . . ), a switching circuit (28-1,2 . . . ) operating in response to the outputs of the first and second comparators of a previous stage to selectively couple one of a third reference voltage ($-V_{ref}$), a fourth reference voltage (GND), and a fifth reference voltage ($+V_{ref}$) to a second input of the summer (15-1,2 . . . ). Each subsequent stage also includes a full adder (46-1,2 . . . ) having a first input coupled to the first output (26-2A), a second input coupled to the second output (26-1B). The full adder (46-1,2 . . . ) produces bit information less significant than the MSB bit information. In the described embodiments, the third reference voltage is a negative reference voltage ($-V_{ref}$) the fourth reference voltage is a ground reference voltage, the fifth reference voltage is a positive reference voltage ($+V_{ref}$). The first reference voltage is midway between the third reference voltage and the ground reference voltage, and the second reference voltage is midway between the ground reference voltage and the fifth reference voltage. Each switching circuit (28-1,2 . . . ) operates to decode one of three states represented by the first (17A) and second (17B) comparators of the previous stage. The plurality of stages include a second group of subsequent stages of lower binary bit significance than the first group of subsequent stages, the first group of subsequent stages being recursively self-calibrated, the second group of subsequent stages being not self-calibrated.

In the described embodiment, the pipeline ADC is a self-calibrating pipeline ADC including a plurality of analog-to-digital conversion units and a recursive calibrating section (32,14-5,41,40A-D of FIG. 6) operable for calibrating errors associated with an immediately preceding first conversion unit (14-4 of FIG. 6). The recursive calibrating section includes a first circuit for receiving an analog output signal (24-4 of FIG. 6) generated from the first conversion unit (14-4) in response to an analog input signal (24-3) provided to the first conversion unit, a second circuit (28-5) for receiving a digital output signal (26-4A,26-4B) generated from the first conversion unit (14-4) in response to a digital input signal (26-3A,26-3B) provided to the first conversion unit (14-4), a third circuit (41,32 of FIG. 6) for generating a conversion signal (X) corresponding to a quantized representation of the analog output signal (24-4 of FIG. 6), and a fourth circuit (40A–D of FIGS. 5 and 6) for generating a calibration signal (Y) having a value equal to the conversion signal (X) in response to the digital input signal being a first digital value ("0") and having a value equal to the sum of the conversion signal (X) and a calibration value ($S_1$-$S_2$ or $S_3$-$S_4$) in response to the digital input signal being a second digital value ("1").

BRIEF DESCRIPTION OF THE DRAWINGS

FIG. 1A is a block diagram of portions of a prior art pipeline ADC.

FIG. 1B is a block diagram of a prior art self-calibrating pipeline ADC including the pipeline ADC of FIG. 1A.

DETAILED DESCRIPTION OF THE PREFERRED EMBODIMENTS

Figure 1C:
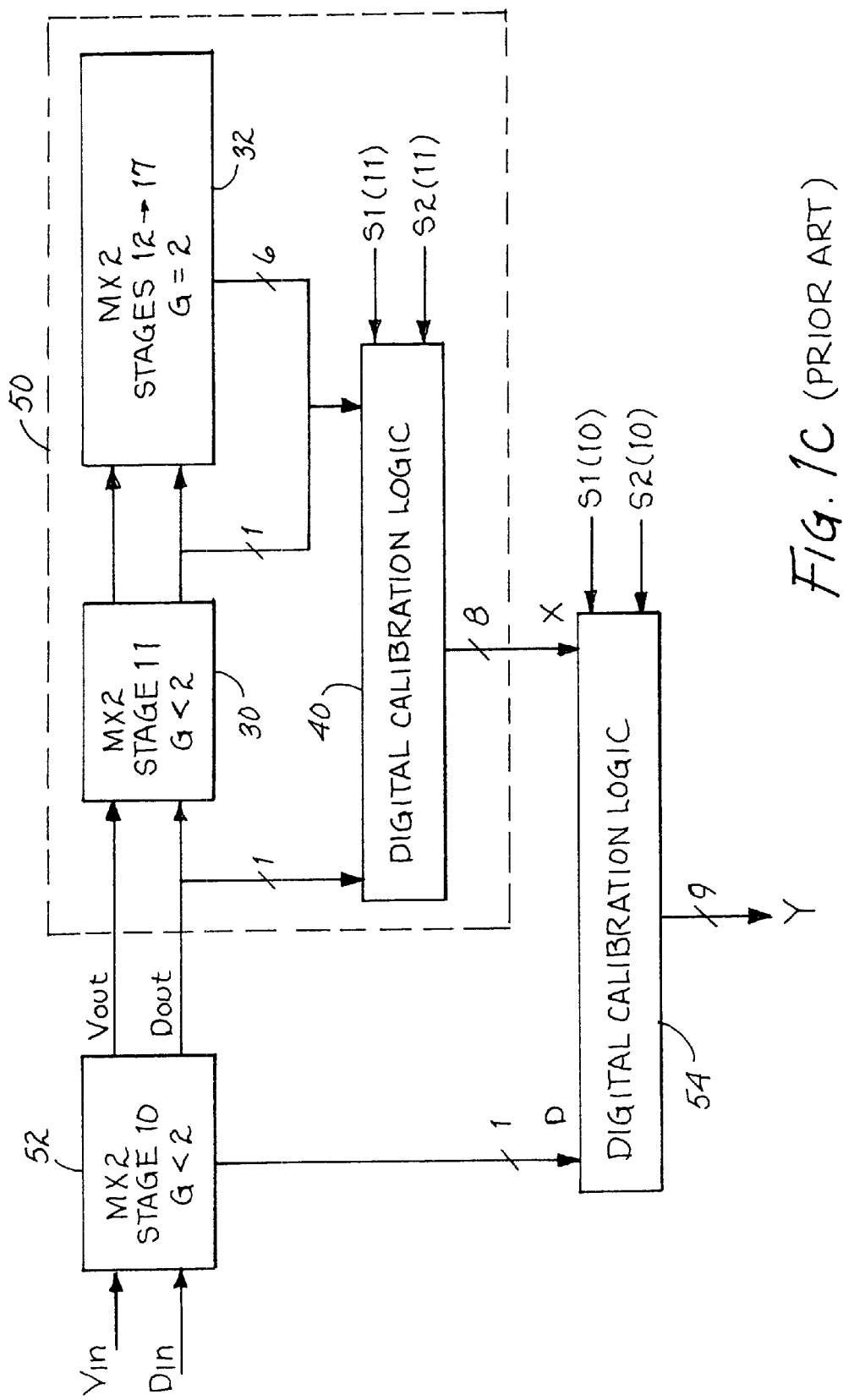
FIG. 1C is another block diagram useful in explaining the self-calibrating operation of the self-calibrating pipeline ADC of FIGS. 1A and 1B.

By way of definition, the term "calibration setup operation" refers to the recursive procedure for measuring and storing the calibration constants for each of the bit stages to be self-calibrated so as to smooth out discontinuities in the ADC transfer characteristic during normal analog-to-digital conversion operation. That procedure is essentially the same as in the above mentioned '027 patent. The term "normal self-calibrating operation" as used herein refers to the procedure of using the previously determined and stored calibration constants to accomplish self-calibration of a group of most significant bits of the ADC. Above mentioned U.S. Pat. No. 5,499,027 by Karanicolas et al., which is entitled DIGITALLY SELF-CALIBRATING PIPELINE ANALOG-TO-DIGITAL CONVERTER and issued Mar. 12, 1996, is incorporated herein by reference. Where convenient, the same reference numerals are used in the drawings of the present invention as in prior art FIGS. 1A–C to designate similar parts.

Figure 2:
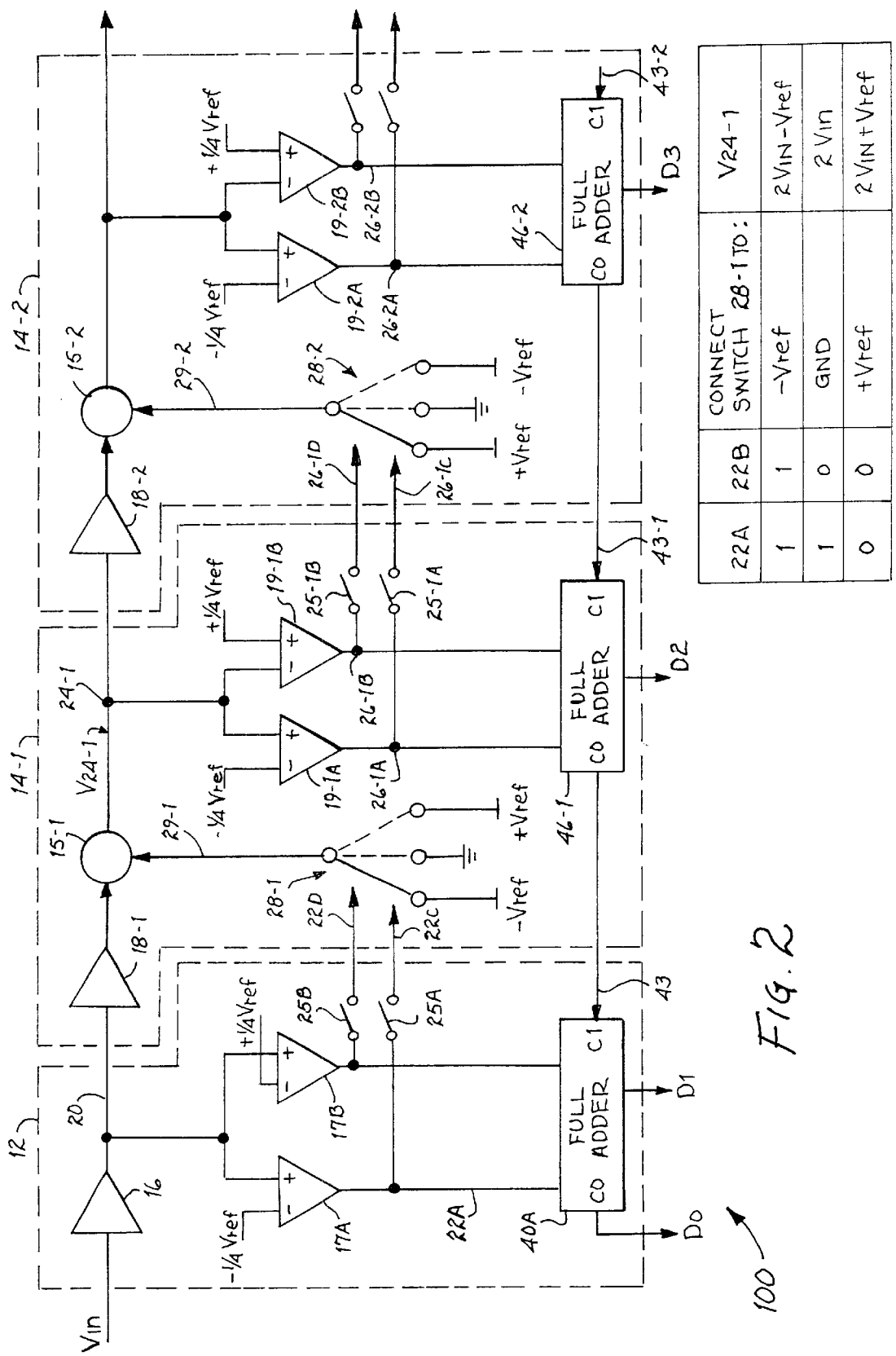
FIG. 2 is a block diagram of a portion of the self-calibrating pipeline ADC of the present invention.

FIG. 2 shows the basic structure of a self-calibrating pipeline ADC 100, without the calibration logic. In some ways, the structure of self-calibrating pipeline ADC 100 resembles that of the pipeline ADC of prior art FIGS. 1A–C. However, in S/H (sample and hold) or input stage 12 and in each "subsequent" stage 14-1,2 . . . of self-calibrating pipeline ADC 100 an entirely different comparator circuit is used than in prior art FIGS. 1A–C. Also, an entirely different switch circuit is used in each subsequent stage 14-1,2 . . . of self-calibrating pipeline ADC 100 than in prior art FIGS. 1A–C. Also, in the first "subsequent" stage 14-1 of self-calibrating pipeline ADC 100 the switch circuit 28-1 functions as a two-bit, three-state DAC, whereas as prior art FIG. 1A the corresponding one-bit switch functions as a one-bit, two-state DAC. Similarly, corresponding two-bit, three state DACs are implemented by switches 28-2,3,4,5 in stages 14-2,3,4,5, respectively, the latter three stages not being shown. Consequently, the calibration setup algorithm is substantially different than for the pipeline ADC of prior art FIGS. 1A–1C.

The comparator circuitry of S/H stage 12 of self-calibrating pipeline ADC 100 includes two comparators 17A and 17B, two reference voltages $-\frac{1}{4}V_{ref}$ and $+\frac{1}{4}V_{ref}$, and two digital output conductors 22A and 22B. The (+) inputs of comparators 17A and 177B are connected to the output 20 of a unity gain amplifier 16, which receives the analog input signal Vin of pipeline ADC 100. The (−) input of comparator 17A is connected to $-\frac{1}{4}V_{ref}$. The (−) input of comparator 17B is connected to $+\frac{1}{4}V_{ref}$. The outputs of comparators 17A and 17B are connected to digital output conductors 22A and 22B, respectively. Output conductor 22A is coupled by a switch 25A to a switch control conductor 22C of the first "subsequent" stage 14-1 and also is coupled to one input of a full adder 40A, which includes a carry out (CO) output that produces uncalibrated MSB bit D0 and a sum output that produces bit D1 Output conductor 22B is coupled by a switch 25B to switch control conductor 22D of the first stage 14-1 and also is coupled to another input of full adder 40A.

Similarly, the comparator circuit of first "subsequent" stage 14-1 includes two comparators 19-1A and 19-1B, the (+) inputs of which are coupled to conductor 24-1 to receive an analog output signal $V_{24-1}$ produced by a summer 15-1 in stage 14-1. The analog signal $V_{24-1}$ produced by summer 15-1 of stage 14-1 is also applied as an analog input to the next subsequent stage 14-2. An amplifier 18-1 of gain slightly greater than 2 is included in at least stage 14-1. Summer 15-1 has one input coupled to the output of amplifier 18-1 and a second input coupled to conductor 29-1 to receive the analog output signal $-V_{ref}$, GND or $+V_{ref}$ produced by switch 28-1 in response to digital signals received from the digital outputs 22A and 22B of comparators 17A and 17B in input stage 12 when switches 25A and 25B are closed. During the calibration, switches 25A and 25B are opened so that conductors 22C and 22D will be forced to levels according to the table in FIG. 2. The digital output 26-1A of comparator 19-1A is connected to one input of a full adder 46-1 and also is coupled by a switch 25-1A to the switch control conductor 26-1 C of the next stage 14-2. The digital output 26-11B of comparator 19-11B is connected to another input of full adder 46-1 and also to a control input 26-1D of next subsequent stage 14-2.

Switch 28-1 of stage 14-1 functions as a 2-bit, three-state DAC in response to the digital signals on conductors 22A and 22B, and produces an analog output applied by conductor 29-1 to an input of analog summer 15-1. The three poles of switch 28-1 are connected to $-V_{ref}$ ground, and $+V_{ref}$ respectively. FIG. 2 shows the truth table for the digital signals on conductors 22A and 22B and the resulting analog output signal produced on conductor 29-1. The two comparators 17A and 17B of input stage 12 produce three digital states 11, 10, and 00 of conductors 22A and 22B in response to the analog voltage on conductor 20. (Thus, the comparator circuitry 17A and 17B can be referred to as representing 1.5 binary bits.)

Figure 3:
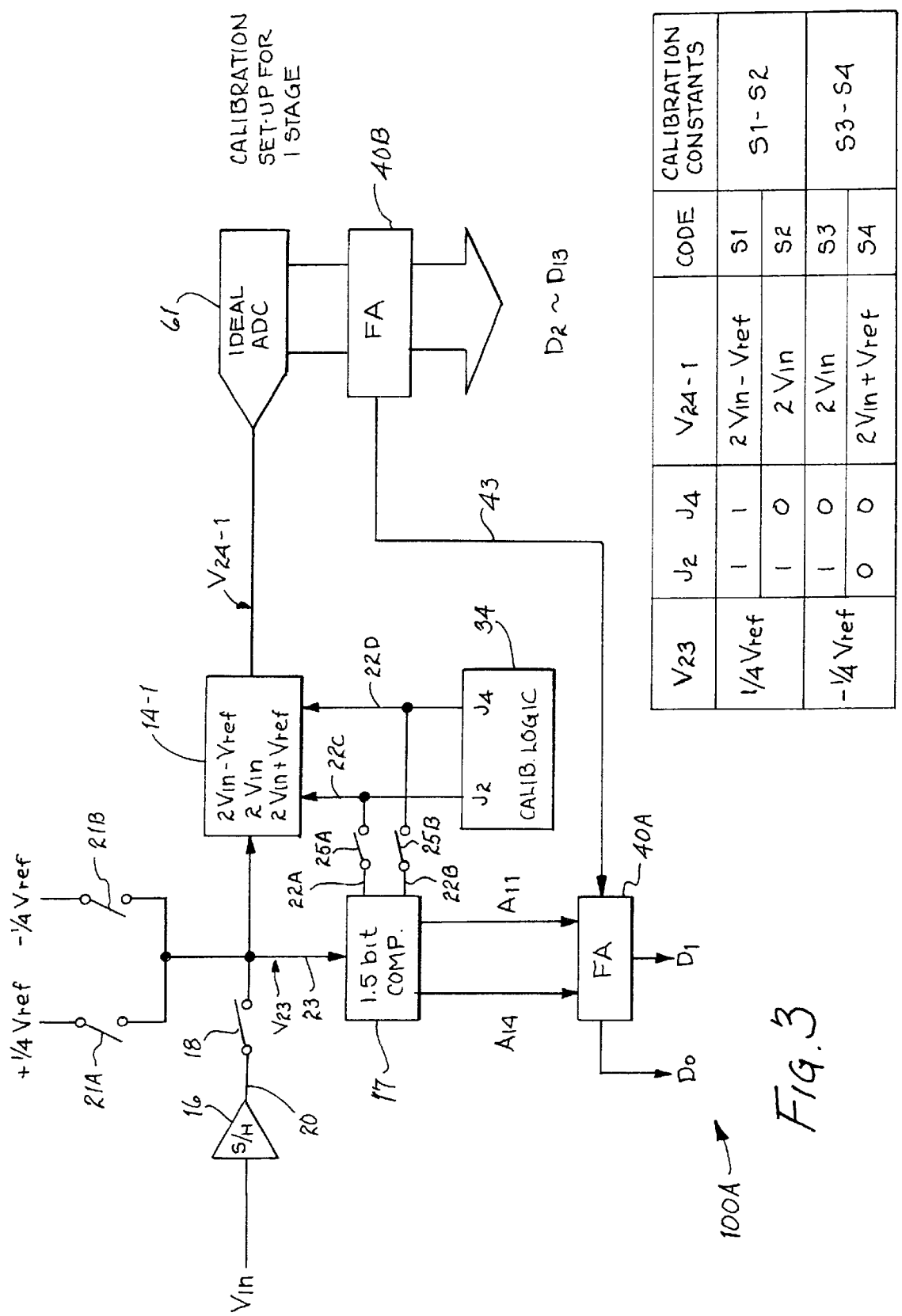
FIG. 3 is a block diagram useful in explaining the self-calibrating cycle for one stage of the self-calibrating pipeline ADC of the present invention.

The carry input (CI) of full adder 40A is connected to conductor 43 which conducts error correcting information fed back from the CO output of the full adder of the next stage as shown in FIG. 3. The output of full adder 40A produces the uncalibrated digital bit signal D1 of the pipeline ADC, which has been corrected for certain errors.

The output $V_{24-1}$ of analog summer 15-1 thus is produced on conductor 24-1 in response to Vin as represented by the output of amplifier 18-1 and also in response to one of the three states of conductors 22A and 22B. Note that the gains of amplifiers 18-1 and 18-2 do not need to be slightly less than 2 in order to avoid clipping, as is required in the ADC of prior art FIGS. 1A-C. This is because no over-ranging of the uncalibrated digital output of self-calibrating pipeline ADC 100 can occur due to small deviations of the gains of amplifiers 18-1 and 18-2 from a gain of 2.

The stages 14-2,3 . . . all are essentially identical to first stage 14-1. Operational amplifier open loop gains of the less significant stages do not need to be very accurate. The output 26-1A of comparator 19-1A and the output 26-1B of comparator 19-1B constitute a digital output that is applied to the digital control inputs of switch 28-2 of second stage 14-2 when switches 25-1A and 25-1B are closed. Preferably, the amplifiers of all of the self-calibrated stages 14-1,2 . . . have a gain slightly greater than 2, so as to ensure that under worst case conditions Dout is equal to at least all "1"s when Vin is at its full scale value. However, if the gain of the amplifier of at least one of stages 14-1,2 . . . exceeds 2 enough that there are no missing codes when Vin is at its full scale value, then the gains of the amplifiers of the other stage do not need to exceed 2.

One of the most important advantages of using the 1.5-bit comparator circuit in self-calibrating pipeline ADC 100 and in using the $+\frac{1}{4}V_{ref}$ ground, and $-\frac{1}{4}V_{ref}$ reference voltages is that the previously mentioned worst case major code transition points are not located near the ground reference voltage, and instead are located at $+\frac{1}{4}V_{ref}$ and $-\frac{1}{4}V_{ref}$ volts. Consequently, there is no significant distortion at the zero-crossing point of self-calibrating pipeline ADC 100, even for very low amplitude differential analog input signals in a fully differential implementation of the system shown in prior art FIGS. 1A–1C.

Another important advantage of self-calibrating pipeline ADC 100 of FIG. 2 is that no problem of clipping the digital output signals is encountered even if the gain G for the stage being calibrated is greater than 2. Furthermore, the gain G for each stage in self-calibrating pipeline ADC 100 is be made slightly greater than 2 to ensure that the digital output value of all "0"s is certain to be produced when Vin is zero volts and the digital output value of all "1"s is certain to be produced when Vin is equal to its full scale value.

Figure 7A:
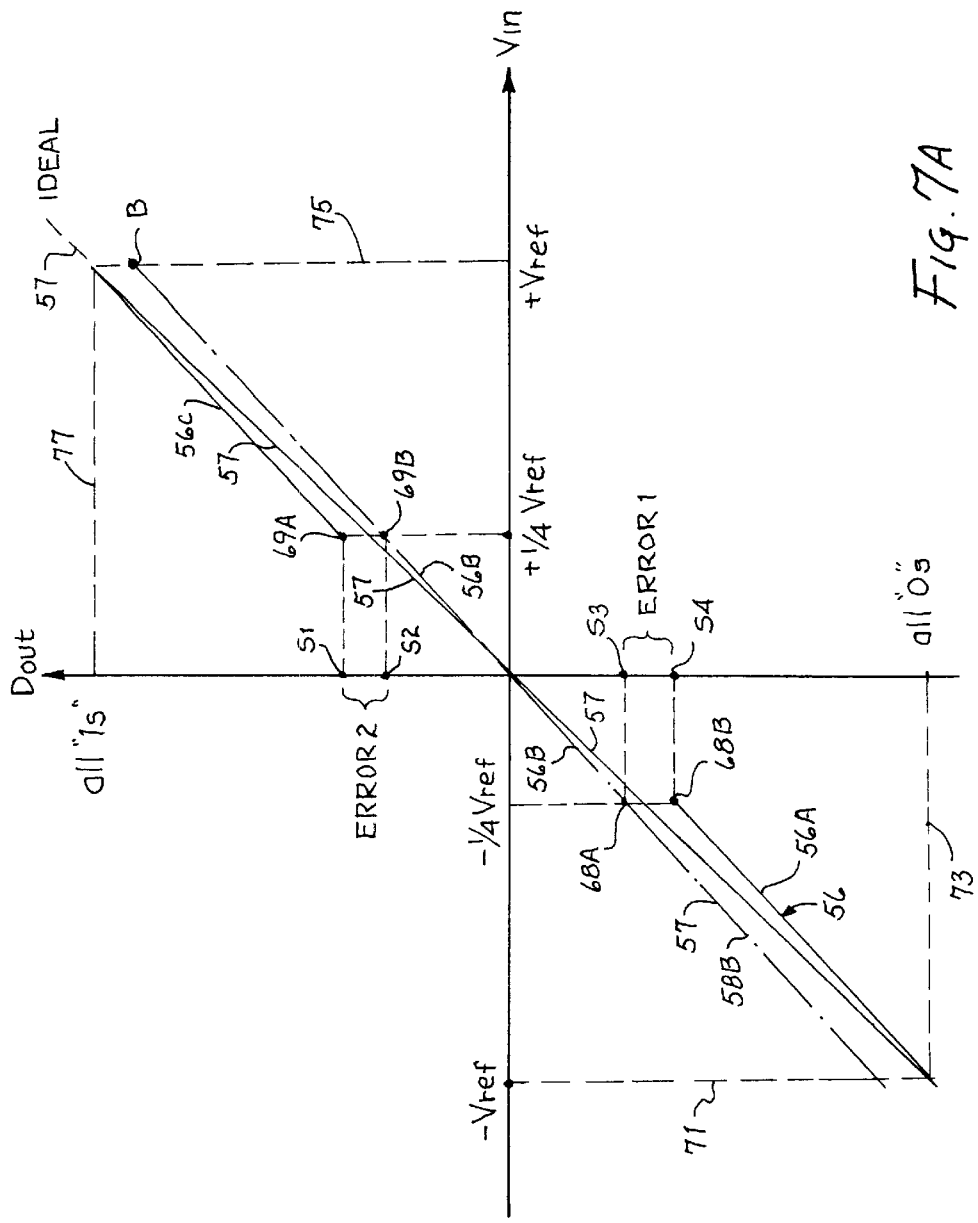
FIG. 7A use is a graph of the transfer characteristic of a bit stage to be calibrated in the embodiment of FIG. 3A for a stage gain G<2 and is useful in explaining how missing codes occur for G<2.
Figure 7B:
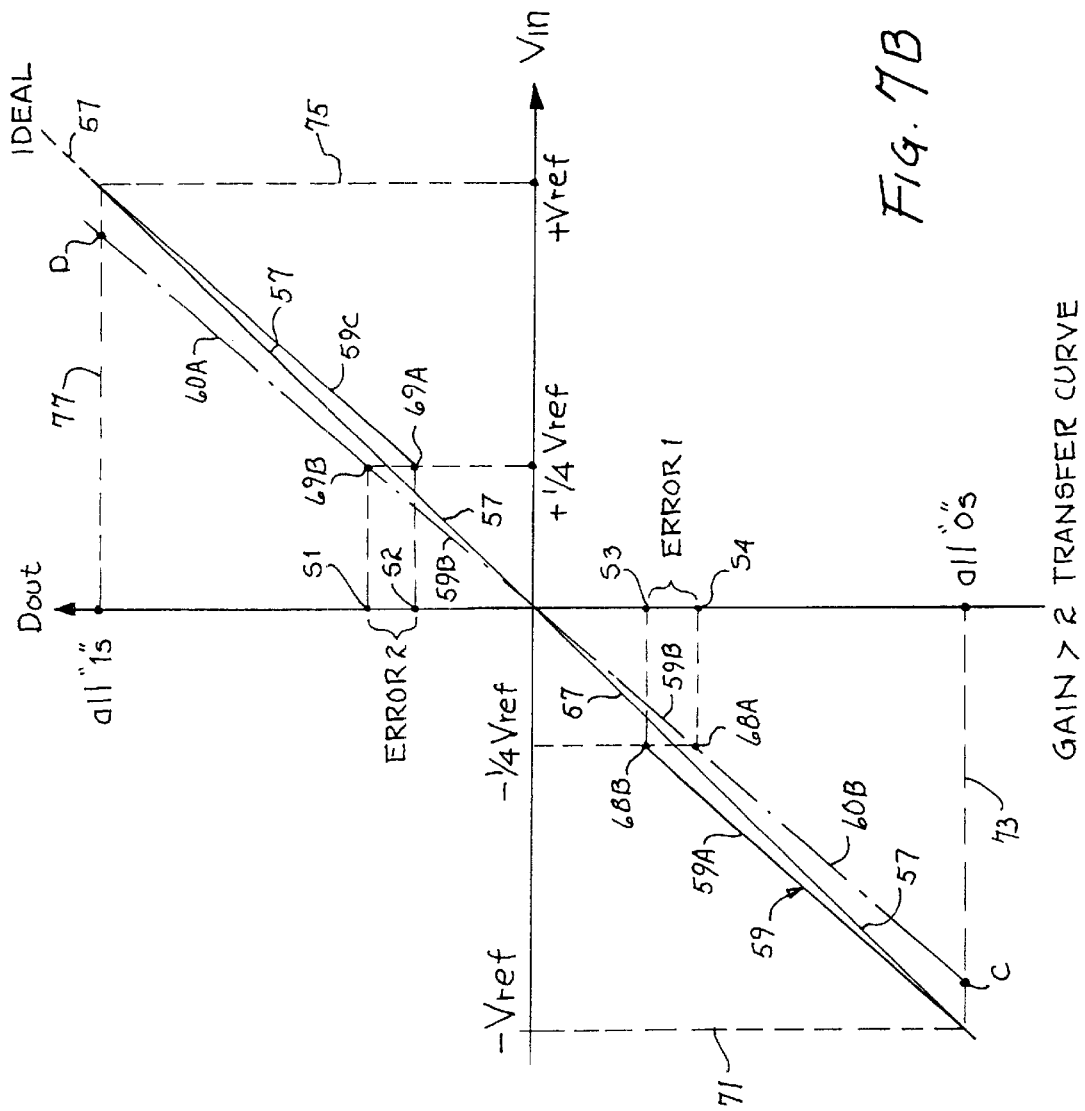
FIG. 7B is a graph of the transfer characteristic of a bit stage to be calibrated in the embodiment of the FIG. 3A for a stage gain G>2, and is useful in explaining how the missing codes are avoided for G>2.

FIG. 3 is a block diagram that is somewhat similar to prior art FIG. 1B. The truth table shown in FIG. 3 shows how the calibration constants $S_1$–$S_2$ and $S_3$–$S_4$ are measured during the calibration setup operation for the MSB stage 14-1 of self-calibrating pipeline ADC 100. Subsequently, described FIGS. 7A and 7B illustrate the calibration constants $S_1$–$S_2$ and $S_3$–$S_4$.

To measure $S_1$–$S_2$ for stage 14-1, the output of S/H amplifier 16 is disconnected from conductor 23 by opening switch 18. With switch 18 open to disconnect conductor 23 from the output 20 of amplifier 16, the voltage $V_{23}$ is forced to either $+V_{ref}$ or $-V_{ref}$ by closing switch 21A or switch 21B, respectively. Meanwhile, switches 25A and 25B are opened, and the digital signals on conductors 22C and 22D are applied as inputs to switch 28-1 (FIG. 2). In this manner, values J2 and J4 are forced by a calibration logic circuit 34 onto conductors 22C and 22D, respectively, according to the truth table in FIG. 3 so that stage 14-1 produces the signal $V_{24-1}$ on conductor 24-1 with the values indicated in the truth table. The resulting calibration constants $S_1$–$S_2$ and $S_3$–$S_4$ for stage 14-1 indicated in the truth table of FIG. 3 are thereby produced.

Figure 4:
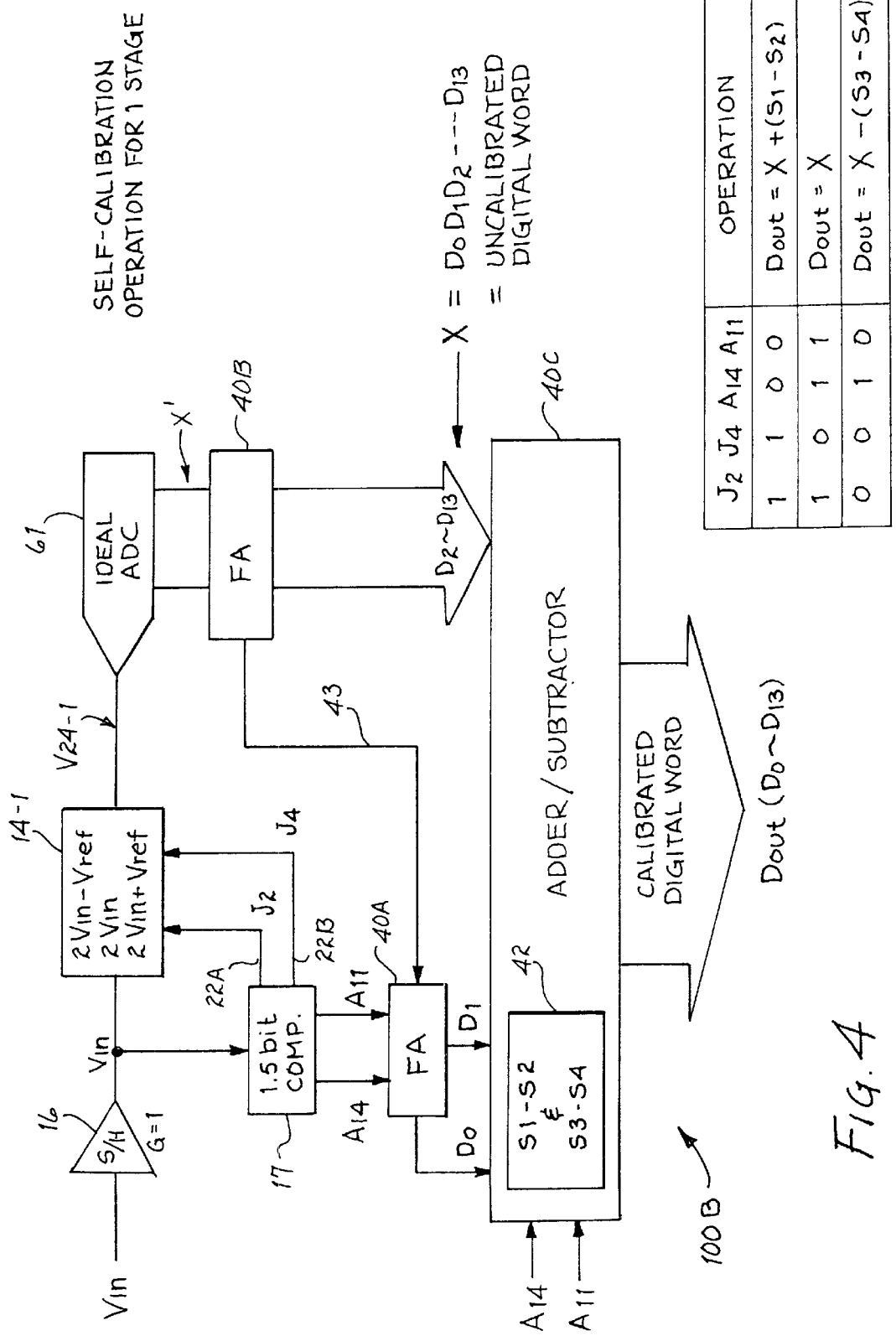
FIG. 4 is another block diagram useful in explaining the operation of the self-calibrating pipeline ADC of the present invention.
Figure 8:
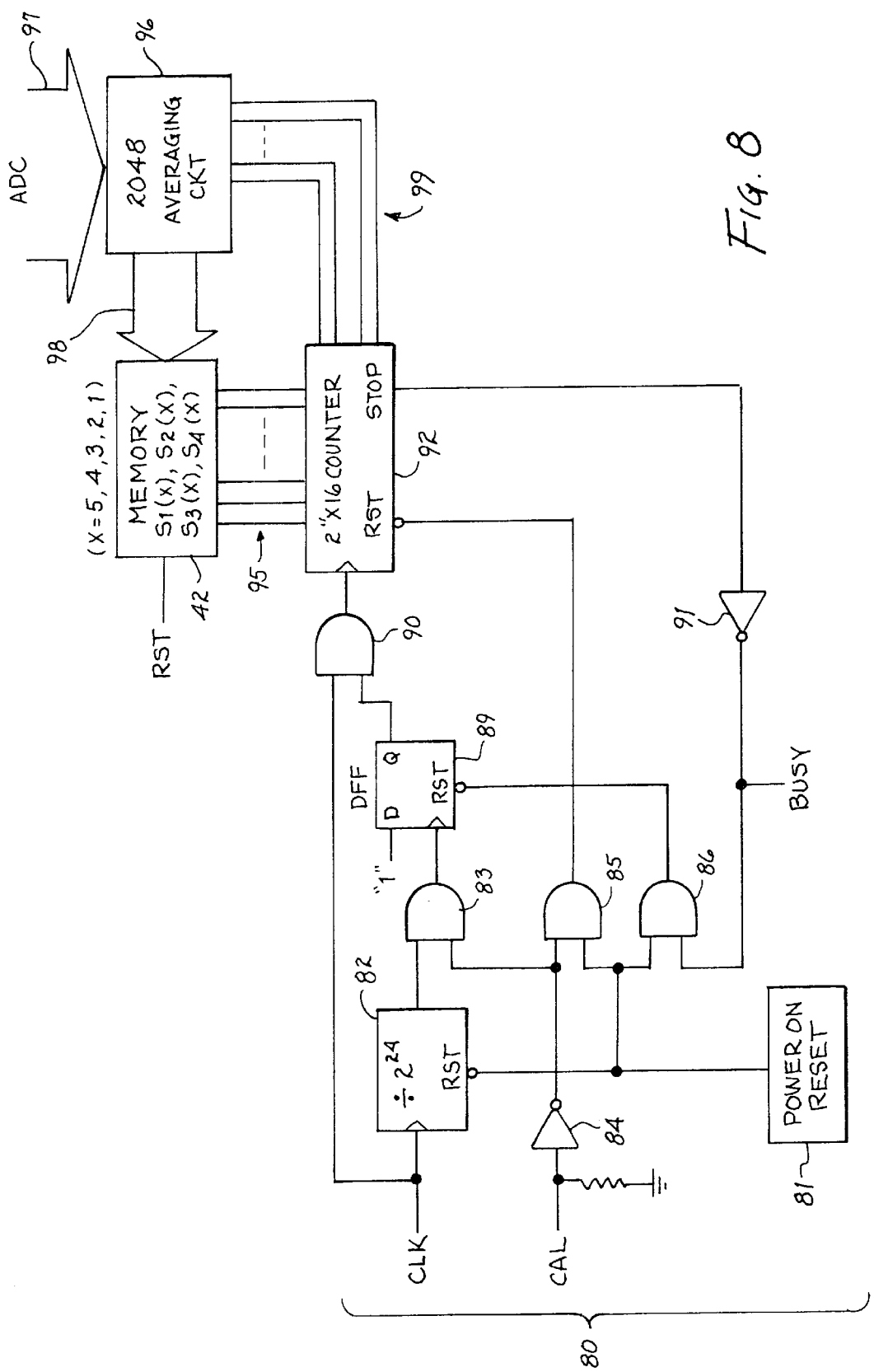
FIG. 8 is a block diagram of self-calibrating logic used in the present invention.

In self-calibrating pipeline ADC 100, the process of obtaining the calibration coefficients $S_1$–$S_2$ and $S_3$–$S_4$ for each stage to be self-calibrated involves repeatedly performing the function of obtaining the uncalibrated digital word X constituting the bits D0D1 . . . D13 for each stage, as shown in FIG. 4 for stage 14-1, starting with the least significant stage to be calibrated, and then taking the average of the many resulting values of each code $S_1$, $S_2$, $S_3$ and $S_4$ to obtain the average values of each of $S_1$, $S_2$, $S_3$ and $S_4$ (for that stage) which are shown in FIG. 7B, to obtain the calibration constants $S_1$–$S_2$ and $S_3$–$S_4$ shown in the truth table of FIG. 3. The calibration set-up algorithm for self-calibration of Dout for stage 14-1 is shown in the table in FIG. 4. The calibration set-up algorithms for the earlier-calibrated less significant stages are similar Subsequently described FIG. 8 shows control circuitry 80 used for power-on-reset operation, and also shows an averaging circuit 96. The control circuitry 80 and the averaging circuit 96 of FIG. 8 cause the uncalibrated digital output X to be generated 2048 times in the averaging process with switches 25A and 25B open, switch 18 open, switch 21A closed, and switch 21B open, with J2 and J4 forced to the states 1 and 1, respectively, as shown in FIG. 3. The average of the 2048 values of X is designated $S_1$. The same procedure is repeated 2048 times with J2 equal to 1 and J4 equal to 0, and the average is designated $S_2$. Then $S_1$–$S_2$, which is designated as ERROR2 in FIG. 7B, is computed. Similarly, with switch 21A open and switch 21B closed, the average codes $S_3$ and $S_4$ are computed, and then $S_3$–$S_4$, which is designated as ERROR1 in FIG. 7B, is computed. The calibration constants $S_1$–$S_2$ and $S_3$–$S_4$ for each stage to be self-calibrated then are stored in calibration constant memory 42 in FIG. 4.

FIG. 4 shows the basic circuit configuration 100B for normal self-calibrating operation of one stage, in this case stage 14-1, of self-calibrating pipeline ADC 100A after the necessary calibration information has been measured (as described above with reference to FIG. 3) and stored in a suitable memory 42. (Note that stage 14-1 actually is the last stage to be calibrated.

The less significant stages 14-5,4,3,2 are calibrated earlier in descending order using the calibration constants $S_1$–$S_2$ and $S_3$–$S_4$ previously stored for those stages.) In FIG. 4, the digital outputs D0 and D1 are produced by full adder (FA) 40A in response to the two digital outputs A14 and A11 of 1.5-bit comparator 17 (which includes comparators 17A and 17B of FIG. 2) and a full adder (FA) 40B. The less significant bit stages are collectively represented as an "ideal" ADC 61, the input of which receives the analog signal $V_{24-1}$ and produces an initial uncalibrated digital output word X'. Full adder 40B and full adder 40A perform an incidental error correction function on the word X' to produce the complete uncalibrated digital word X including bits D1,2 . . . 13. Full adder 40C adds the calibration constant $S_1$–$S_2$ to X or subtracts the calibration constant $S_3$–$S_4$ from X according to the truth table of FIG. 4 in order to produce the self-calibrated digital output Dout, which constitutes the bits D0D1 . . . D13.

Referring to FIG. 2, it should be appreciated that in any stage, such as S/H stage 12 in FIG. 2, the input offset voltage errors of the two comparators, e.g., comparators 17A and 17B, causes errors at their respective outputs 22A and 22B. Such incidental errors can be corrected using error correcting code techniques. The full adder 40A shown in FIG. 2 utilizes feedback 43 from the next stage, which is shown in FIG. 4 as including full adder 40B and the above mentioned "ideal" ADC 61 (which represents all of the less significant stages) to correct errors on conductors 22A and 22B.

Figure 5:
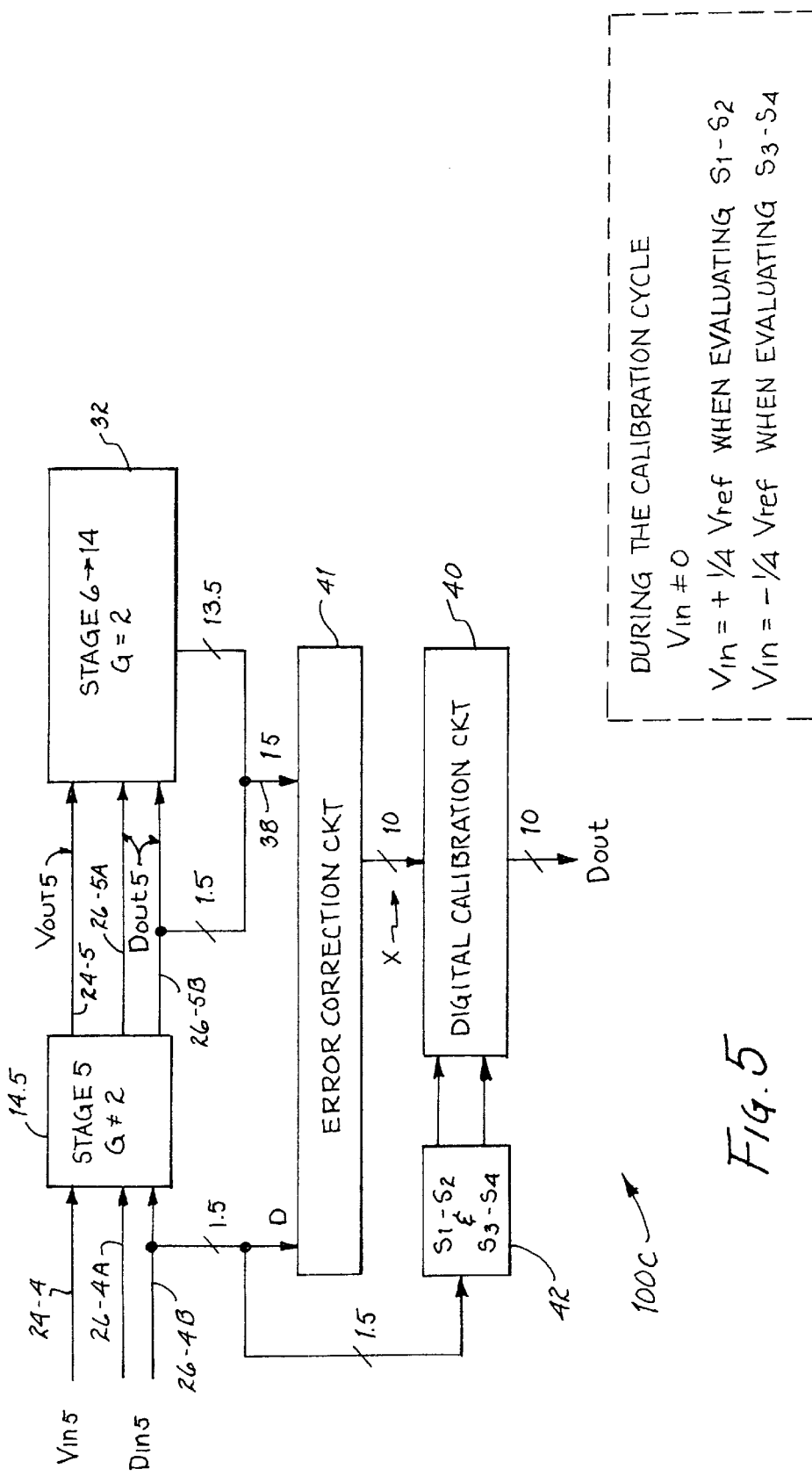
FIG. 5 is another block diagram useful in explaining the operation of the self-calibrating pipeline ADC of the present invention.

FIG. 5 illustrates the configuration 100C of self-calibrating pipeline ADC 100B during the first recursive self calibration operation, which occurs for its fifth most significant stage 14-5. The previously measured values of calibration constants $S_1$–$S_2$ and $S_3$–$S_4$, previously obtained and stored in memory 42 are used in the self-calibration operation.

Figure 6:
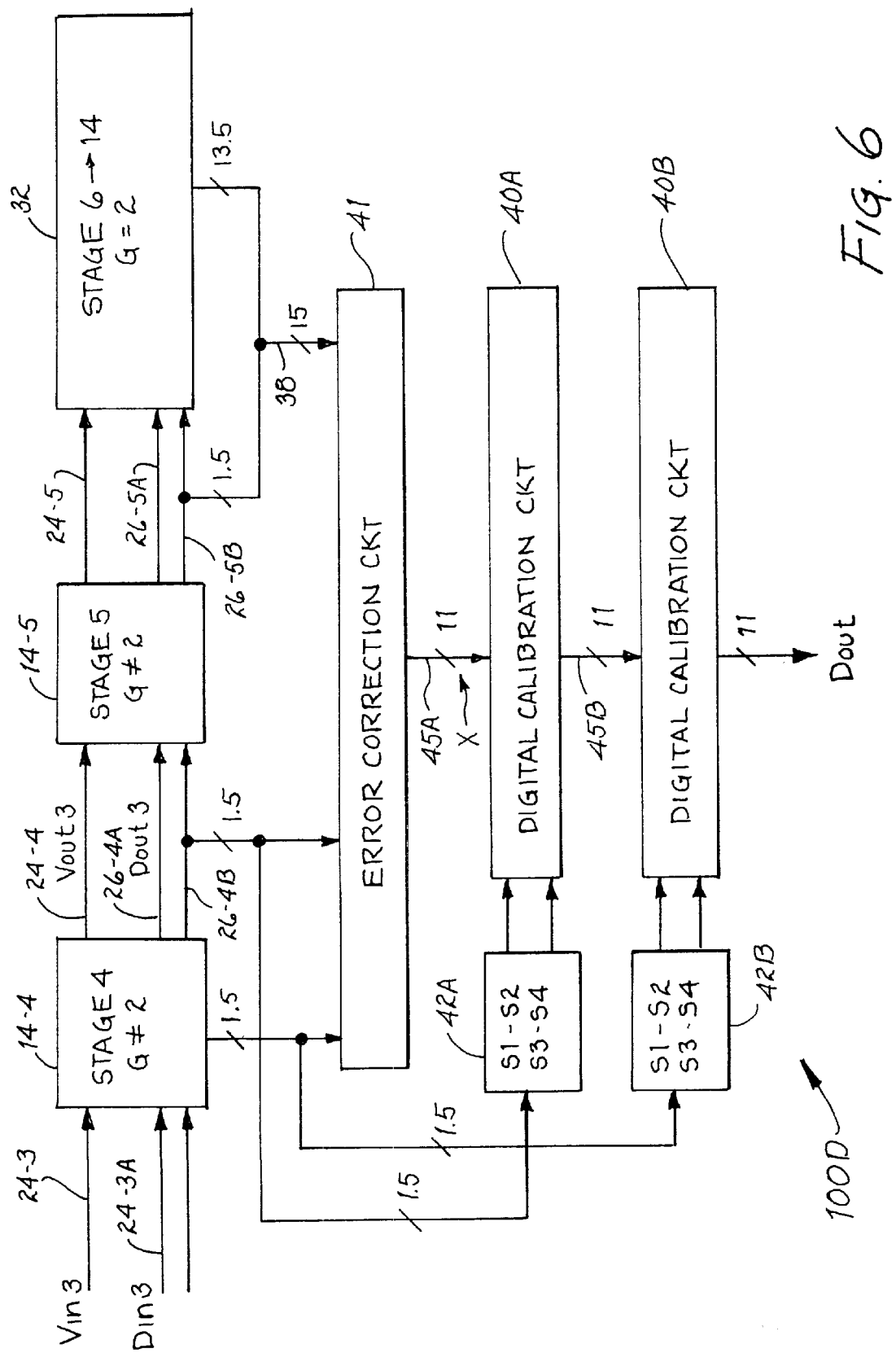
FIG. 6 is another block diagram useful in explaining operation of the self-calibrating pipeline ADC of the present invention.

FIG. 6 illustrates a configuration 100D wherein the second recursive step of self calibration of the most significant stage 14-4 is self calibrated. Uncalibrated stages 6 through 14 have a gain G of 2. Each of stages 6–14 is identical to stage 14-1 or 14-2 of FIG. 2, and each is substantially different than the stages 14-1 or 14-2 in prior art FIG. 1A. This is because the dual comparators, such as 19-1A and 19-1B in FIG. 2, the three reference voltages $+\frac{1}{4}V_{ref}$, GND, and $-\frac{1}{4}V_{ref}$, the two-bit digital output 26-1A, 26-1B of dual comparators 19-1A and 19-1B, and the single pole, double throw switch 28-2, which function, respectively, as a two-bit, three-state ADC and a one-bit DAC that is incapable of over ranging at full-scale values, are substantially different than the single comparator 19-1 of prior art FIG. 1A which functions as a one-bit ADC and the single pole, double throw switch 28-1 which functions as a one-bit DAC.

It is important that the described embodiment of the invention does not need to have its gain G less than 2 to avoid over-ranging at full-scale values so as to cause the above described difficulties in calibration. This is because in the described embodiment of the invention, $-\frac{1}{4}V_{ref}$, GND, and $+\frac{1}{4}V_{ref}$ are well within the full analog input range, in contrast to the self-calibrating ADC of prior art FIGS. 1A–C which requires that gain G be less than 2 to avoid such over-ranging and resulting calibration difficulties. Preferably, the gain 6 of the self-calibrated stages 14-1 through 14-5 is greater than 2. This provides the benefit of avoiding the above mentioned missing codes at and/or near the maximum and minimum full scale analog input values and provides full scale maximum and minimum values of the digital output Dout.

To better understand the invention, it may be helpful to refer to FIGS. 7A and 7B. As an example, FIG. 7A shows the ADC transfer curve for a gain G of stage 14-1 less than 2 due to errors in stage 14-1 only, with stages 14-2,3,4,5 assumed to be ideal. FIG. 7B shows the ADC transfer curve for a gain G of stage 14-1 greater than 2 due to errors in stage 14-1 only, with stages 14-2,3,4,5 assumed to be ideal. The Dout vs. Vin transfer curve of any of self-calibrating stages 14-1,2 . . . 5 of FIG. 2 for a gain G of less than 2 (as in the self-calibrating stages of prior art FIG. 1A) is shown in FIG. 7A. Referring to FIG. 7A, the "uncalibrated" transfer curve is designated by numeral 56, which includes segments 56A, 56B and 56C. Segment 56A extends between the point at which Vin is equal to $-V_{ref}$ and Dout is all "0"s and point 68B of a discontinuity 68A,B which occurs between segments 56A and 56B. Segment 56B extends from point 68A of a discontinuity 68A,B which is caused by missing codes that occur during switching of comparator 17A when Vin is equal to $-¼V_{ref}$ (due to its input offset voltage and other parameters) to point 69B of discontinuity 69A,B which occurs between segments 56B and 56C. Discontinuity 69A,B is caused by missing codes that occur during switching of comparator 17B when Vin is equal to $+¼V_{ref}$, due to its gain errors, reference voltage errors, and/or charge injection errors. The number of missing codes at each point depends on the amounts of the foregoing errors. Similar discontinuities also occur during switching of comparators 19-1A,B in stage 14-1, comparators 19-2A,B in stage 14-2, etc. when Vin is equal to $-¼V_{ref}$ and $+¼V_{ref}$. The values of Dout at points 69A, 69B, 68A, and 68B are $S_1$, $S_2$, $S_3$, and $S_4$, respectively.

In FIG. 7A, and also in FIG. 7B, straight line 57 indicates an ideal transfer curve of ADC 100. The error of segment 56A at discontinuity 68A,B is ERROR1, which is the difference between codes $S_1$ and $S_2$. Similarly, ERROR2, the difference between codes $S_3$ and $S_4$, is the error of segment 56B at discontinuity 69A,B.

Note that the dashed lines 71, 73, 75, and 77 in FIG. 7A designate minimum and maximum values of Vin and Dout. Dashed line 58B between point A and point 68A shows the effect of adding a correction constant equal to ERROR1 to each point of segment 56A to correct it for ERROR1. Note that the dashed line 58B intersects dashed line 71 at point A, where Vin is equal to $-V_{ref}$ and that point A is located above dashed line 73 corresponding to Dout equal to all "0"s. This means that for a gain G less than 2, the portion of the self-calibrated transfer curve represented by dashed line 58B shows that Dout can never be equal to or very close to all "0"s. Similarly, note that the dashed line 58A between point 69B and point B intersects dashed line 75 where Vin is equal to $+V_{ref}$. Point B is located below dashed line 77 corresponding to Dout equal to all "1"s, which means that for gain G less than 2, the portion of self-calibrated transfer curve represented by dashed line 58A and shows that Dout can never be equal to or very close to all "1"s. 1.

Thus, use of a gain G of less than 2 (just as in the ADC of prior art FIGS. 1A–C) in the stages to be self-calibrated reduces the dynamic range of the ADC by preventing the digital output from ever being equal to or very close to the minimum-full-scale value of all "0"s and by preventing the digital output from ever being equal to or very close to the maximum-full-scale value of all "1"s.

FIG. 7B shows a transfer curve 59 similar to the one shown in FIG. 7A, except that in FIG. 7B the gain G of stage 14-1 is greater than 2. Transfer curve 59 has three segments 59A, 59B, and 59C. The error quantities ERROR1 and ERROR2 shown in FIG. 7B are similar to the corresponding error quantities shown in FIG. 7A. Dashed line 60B in FIG. 7B extends between point C of dashed line 73 and point 68A, and represents a self-calibrated portion of the transfer curve that results from subtracting ERROR1 from each point of segment 59A. Note that the point C at which the self-calibrated transfer curve portion 60B intersects dashed line 73 corresponds to Dout equal to all "0"s for a value of Vin which is less negative than $-V_{ref}$ Similarly, self-calibrated transfer curve portion 60A extends between point 69B and point D of dashed line 77, and represents a self-calibrated portion of the transfer curve that results from adding ERROR2 to each point of segment 59C. Note that the point D intersects dashed line 77 corresponding to Dout equal to all "1"s for a value of Vin which is slightly less positive than $+V_{ref}$. What this means is that if the gain G for all of the self-calibrating stages of ADC 100A is greater than 2, then Dout is assured of having the maximum possible dynamic range from all "0"s to all "1"s.

FIG. 8 shows above mentioned control circuit 80, an averaging circuit 96, and above mentioned calibration constant memory 42. Averaging circuit 96 performs the above mentioned averaging of the values of $S_1(x)$, $S_2(X)$, $S_3(x)$ and $S_4(x)$, and stores them in memory 42, wherein x has, for example, the consecutive values 5, 4, 3, 2, and 1 and indicates the number of the stage being calibrated, the stage number 5 being the least significant stage being calibrated, and the stage number 1 being the most significant stage being calibrated.

Control circuit 80 includes a power on reset circuit 81 that produces a power on reset signal as an input to a divide by $2^{24}$ circuit 82 and to one input of each of 2-input AND gates 85 and 86. A clock signal CLK is applied to a clock input of divider circuit 82 and to one input of a 2-input AND gate 90. The output of divider circuit 82 is connected to one input of a 2-input AND gate 83. The output of AND gate 83 is connected to the clock input of a D type flip flop 89. The D input of flip flop 89 is connected to receive a logical "1". The Q output of flip flop 89 is connected to the other input of AND gate 90. Divide-by-$4^{24}$ circuit 82 provides a relatively long delay during which the reference voltages $V_{ref}$, $-V_{ref}$, $¼V_{ref}$ and $-¼V_{ref}$ can settle.

A calibration signal CAL is applied to the input of an inverter 84, the output of which is connected to one input of AND gate 83 and to one input of AND gate 85. The output of AND gate 90 is connected to the clock input of a $2^{11}$ times 16 counter 92. A reset input of counter 92 is connected to the output of AND gate 85. A STOP output of counter 92 is connected to the input of an inverter 91, the output of which produces a BUSY signal which is applied to the other input of AND gate 86. The BUSY signal informs a user when calibration set-up operation of ADC 100B is occurring, i.e., when new calibration constants are being measured and stored; ADC 100B is unavailable for normal ADC operation during the BUSY signal.

Counter 92 generates addresses on conductors 95 which are connected to address inputs of memory 40 into which the calibration constants $S_1(x)$–$S_2(x)$ and $S_3(X)$–$S_4(x)$ are to be stored after they have been measured. Counter 92 also produces signals on its output conductors 99 which control averaging circuit 96 so that it operates to sample the uncalibrated digital output X' on conductors 97 and produce the average of 2,048 such samples on conductors 98, which are connected to the data input conductors of memory 11. The averaged calibration constants then are stored at the appropriate addresses in memory 40. Control circuit 80 operates to cause ADC 100B to be calibrated, i.e., to perform the above-mentioned calibration set-up operation, every time power is applied thereto. Then, if the user wishes to calibrate ADC 100B again, the user must apply a calibration command signal to the CAL input, which normally is held at ground by a pull-down resistor.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, more than two comparators could be used in each of the input stage 12 and subsequent stages 14-1,2 . . . , with a corresponding number of additional reference voltages coupled to their (−) inputs. The missing codes described above could be eliminated without increasing the gains of any of the amplifiers of the subsequent stages 14-1,2 . . . to a value greater than 2 by coupling the digital output of the ADC to the input of a digital multiplier having a gain sufficiently greater than unity to ensure an overall gain between the analog input of the pipeline ADC and the output of the digital multiplier at least equal to unity under worst case conditions of comparator offset voltages, amplifier offset voltages, capacitor mismatches, etc. when the analog input is at a full scale value.

What is claimed is:

1. A pipeline ADC comprising a plurality of stages including an input stage and a first group of sequentially coupled subsequent stages, the input stage including a unity gain amplifier having an input for receiving an analog input signal, an output, and at least first and second comparators each having a first input coupled to the output of the unity gain amplifier, the first comparator having a second input for receiving a first reference voltage and an output, the second comparator having a second input for receiving a second reference voltage and an output, and a full adder having a first input coupled to the output of the first comparator, a second input coupled to the output of the second comparator, and an output producing MSB bit information; and each subsequent stage including an amplifier having an input and an output, a summer having a first input coupled to the output of the amplifier of gain greater than 2, a second input, and an output, a switching circuit operating in response to outputs of first and second comparators of a previous stage to selectively couple one of a third reference voltage, a fourth reference voltage, and fifth reference voltage to a second input of the summer, at least first and second comparators each having a first input coupled to the output of the summer, the first comparator of the subsequent stage having a second input for receiving the first reference voltage and an output, the second comparator of the subsequent stage having a second input for receiving the second reference voltage and an output, and a full adder having a first input coupled to the output of the first comparator of the subsequent stage, a second input coupled to the output of the second comparator of the subsequent stage, the full adder producing bit information less significant than the MSB bit information.

2. The pipeline ADC of claim 1 wherein the amplifier of at least one of the subsequent stages has a gain greater than 2.

3. The pipeline ADC of claim 1 wherein the amplifier of each of the subsequent stages has again greater than 2.

4. The pipeline ADC of claim 1 wherein the gains of the amplifiers of the subsequent stages have values such that the overall gain of the pipeline ADC is at least unity so as to ensure that there are no missing output codes when the analog input signal is at a full scale value.

5. The pipeline ADC of claim 1 wherein the third reference voltage is a negative reference voltage, the fourth reference voltage is a ground reference voltage, the fifth reference voltage is a positive reference voltage, and wherein the first reference voltage is between the third reference voltage and the ground reference voltage, and the second reference voltage is between the ground reference voltage and the fifth reference voltage.

6. The pipeline ADC of claim 5 wherein each switching circuit operates to decode three states represented by outputs of first and second comparators of the previous stage.

7. The pipeline ADC of claim 6 including a second group of subsequent stages of lower binary bit significance than the first group of subsequent stages, the first group of subsequent stages being recursively self-calibrated, the second group of subsequent stages being not self-calibrated.

8. In a pipeline ADC including a plurality of stages including an input stage and a first group of sequentially coupled subsequent stages, the input stage including a unity gain amplifier having an input for receiving an analog input signal, an output, and a first comparator having a first input coupled to the output of the unity gain amplifier and a second input for receiving a first reference voltage and an output, each subsequent stage including an amplifier having an input and an output, a summer having a first input coupled to the output of the amplifier of gain greater than 2, a second input, and an output, a switching circuit operating in response to the outputs of a comparator of a previous stage to selectively couple one of a second reference voltage and a third reference voltage to a second input of the summer, a first comparator having a first input coupled to the output of the summer the first comparator of the subsequent stage having a second input for receiving the first reference voltage and an output, the improvement comprising:

a second comparator in the input stage, the second comparator having a second input for receiving a second reference voltage and an output, and a full adder having a first input coupled to the output of the first comparator of the input stage, a second input coupled to the output of the second comparator of the input stage, and an output producing MSB bit information; and each subsequent stage including a second comparator, the second comparator of the subsequent stage having a first input coupled to the output of the summer, the second comparator of the subsequent stage having a second input for receiving the second reference voltage and an output, and a full adder having a first input coupled to the output of the first comparator of the subsequent stage and a second input coupled to the output of the second comparator of the subsequent stage, the full adder of each subsequent stage producing bit information less significant than the MSB bit information.

9. The pipeline ADC of claim 8 wherein the amplifier of at least one of the subsequent stages has a gain greater than 2.

10. The pipeline ADC of claim 8 wherein the gains of the amplifiers of the subsequent stages have values such that the overall gain of the pipeline ADC is at least unity so as to ensure that there are no missing output codes when the analog input signal is at a full scale value.

11. A pipeline ADC comprising a plurality of stages including an input stage and a first group of sequentially coupled subsequent stages, the input stage including a unity gain amplifier having an input for receiving an analog input signal, an output, and at least first and second comparators each having a first input coupled to the output of the unity gain amplifier, the first comparator having a second input for receiving a first reference voltage and an output, the second comparator having a second input for receiving a second reference voltage and an output, and a full adder having a first input coupled to the output of the first comparator, a second input coupled to the output of the second comparator, and an output producing MSB bit information; and each subsequent stage including an amplifier having an input and an output, a summer having a first input coupled to the output of the amplifier of gain greater than 2, a second input, and an output, a digital-to-analog conversion circuit having a plurality of inputs coupled to outputs of first and second comparators of a previous stage, the digital-to-analog conversion circuit having an output coupled to a second input of the summer to convert the outputs of the first and second comparators of the previous stage to a third reference voltage, a fourth reference voltage, or a fifth reference voltage applied to the second input of the summer, at least first and second comparators each having a first input coupled to the output of the summer, the first comparator of the subsequent stage having a second input for receiving the first reference voltage and an output, the second comparator of the subsequent stage having a second input for receiving the second reference voltage and an output, and a full adder having a first input coupled to the output of the first comparator of the subsequent stage, a second input coupled to the output of the second comparator of the subsequent stage, the full adder producing bit information less significant than the MSB bit information.

12. The pipeline ADC of claim 11 wherein the amplifier of at least one of the subsequent stages has a gain greater than 2.

13. The pipeline ADC of claim 11 wherein the gains of the amplifiers of the subsequent stages have values such that the overall gain of the pipeline ADC is at least unity so as to ensure that there are no missing output codes when the analog input signal is at a full scale value.

14. A method of operating a pipeline ADC including a plurality of stages including an input stage and a first group of sequentially coupled subsequent stages, comprising:

applying an analog input signal to an input of a unity gain amplifier in the input stage to produce an output signal;

applying the output signal of the unity gain amplifier to a first input of at least first and second comparators;

applying a first reference voltage to a second input of the first comparator and applying a second reference voltage to a second input of the second comparator, outputs of the first and second comparators representing MSB bit information of the pipeline ADC;

applying the output signal of the unity gain amplifier to an input of an amplifier of a first subsequent stage;

applying an output signal of the amplifier of the first subsequent stage to a first input of a summer;

applying the outputs of the first and second comparators to a digital-to-analog converting circuit in the first subsequent stage to convert the outputs of the first and second comparators to a converted signal equal to one of a third reference voltage, a fourth reference voltage, and fifth reference voltage and applying the converted signal to a second input of the summer;

applying an output signal of the summer to a first input of each of a first and a second comparator of the first subsequent stage;

applying the first reference voltage to a second input of the first comparator of the first subsequent stage and applying a second reference voltage to a second input of the second comparator of the first subsequent stage, outputs of the first and second comparators of the first subsequent stage representing less significant bit information of the pipeline ADC.

15. The pipeline ADC of claim 14 including providing the amplifier of at least one of the subsequent stages with a gain greater than 2.

16. The pipeline ADC of claim 14 including providing the gains of the amplifiers of the subsequent stages have values such that the overall gain of the pipeline ADC is at least unity so as to ensure that there are no missing output codes when the analog input signal is at a full scale value.

17. The method of claim 14 including applying the output of the summer to an input of an amplifier of a second subsequent stage, and applying outputs of the first and second comparators of the first subsequent stage to a digital-to-analog converting circuit in the second subsequent stage.

18. The method of claim 17 wherein the second subsequent stage is essentially similar to the first subsequent stage.

19. A self-calibrating pipeline ADC comprising a plurality of analog-to-digital conversion units and a recursive calibrating section operable for calibrating errors associated with an immediately preceding first conversion unit wherein the recursive calibrating section includes a first circuit for receiving an analog output signal generated from the first conversion unit in response to an analog input signal provided to the first conversion unit, a second circuit for receiving a digital output signal generated from the first conversion unit in response to a digital input signal provided to the first conversion unit, a third circuit for generating a conversion signal corresponding to a quantized representation of the analog output signal, and a fourth circuit for generating a calibration signal having a value equal to the conversion signal in response to the digital input signal having a first digital value, having a value equal to the sum of the conversion signal and a first calibration value in response to the digital input signal being a second digital value, and having a value equal to the difference between the conversion signal and a second calibration value in response to a third digital value, wherein the pipeline ADC includes a first group of successively coupled bit stages including an input stage and a first group of subsequent stages, the input stage including a unity gain amplifier having an input for receiving an analog input signal, an output, and at least first and second comparators each having a first input coupled to the output of the unity gain amplifier, the first comparator having a second input for receiving a first reference voltage and an output, the second comparator having a second input for receiving a second reference voltage and an output, and a fall adder having a first input coupled to the output of the first comparator, a second input coupled to the output of the second comparator, and an output producing MSB bit information; and each subsequent stage including an amplifier having an input and an output, a summer having a first input coupled to the output of the amplifier of gain greater than 2, a second input, and an output, a switching circuit operating in response to the outputs of first and second comparators of a previous stage to selectively couple one of a third reference voltage, a fourth reference voltage, and fifth reference voltage to a second input of the summer, at least first and second comparators each having a first input coupled to the output of the summer, the first comparator of the subsequent stage having a second input for receiving the first reference voltage and an output, the second comparator of the subsequent stage having a second input for receiving the second reference voltage and an output, and a full adder having a first input coupled to the output of the first comparator of the subsequent stage, a second input coupled to the output of the second comparator of the subsequent stage, the full adder producing bit information less significant than the MSB bit information.

20. The pipeline ADC of claim 19 wherein the amplifier of at least one of the subsequent stages has a gain greater than 2.

21. The pipeline ADC of claim 19 wherein the gains of the amplifiers of the subsequent stages have values such that the overall gain of the pipeline ADC is at least unity so as to ensure that there are no missing output codes when the analog input signal is at a full scale value.

22. In the self-calibrating pipeline ADC of claim 19, the improvement wherein the plurality of bit stages includes a second group of successively coupled subsequent stages of lower binary bit significance than the first group of successively coupled subsequent stages, the first group of successively coupled subsequent stages being recursively self-calibrated, the second group of successively coupled subsequent stages being not self-calibrated.

* * * * *